United States Patent

Hayashi et al.

[11] Patent Number: 5,486,709
[45] Date of Patent: Jan. 23, 1996

[54] SURGE PROTECTION DEVICE

[75] Inventors: Yutaka Hayashi, Tsukuba; Masaaki Sato, Machida; Yoshiki Maeyashiki, Chofu, all of Japan

[73] Assignees: Agency of Industrial Science & Technology; Ministry of International Trade & Industry; Sankosha Corporation, all of Tokyo; Optotechno Co., Ltd., Kanagawa, all of Japan

[21] Appl. No.: 38,623

[22] Filed: Mar. 26, 1993

[30] Foreign Application Priority Data

Mar. 27, 1992 [JP] Japan ..................... 4-100233

[51] Int. Cl.$^6$ ............................................. H01L 29/74
[52] U.S. Cl. .................... 257/110; 257/111; 257/497; 257/546
[58] Field of Search ................... 257/110, 111, 257/109, 112, 497, 546, 551, 605, 606, 169, 139, 341; 361/90, 91, 100

[56] References Cited

U.S. PATENT DOCUMENTS

| | | | |
|---|---|---|---|
| 4,631,561 | 12/1986 | Foroni et al. | 257/111 |
| 5,083,185 | 1/1992 | Hayashi et al. | |
| 5,274,253 | 12/1993 | Ogawa | 257/111 |

FOREIGN PATENT DOCUMENTS

| | | | |
|---|---|---|---|
| 414934 | 3/1991 | European Pat. Off. | 257/546 |
| 54-121073 | 9/1979 | Japan | 257/551 |
| 55-65462 | 5/1980 | Japan | 257/109 |
| 61-259501 | 11/1986 | Japan | . |
| 62-65382 | 3/1987 | Japan | . |
| 62-65383 | 3/1987 | Japan | . |
| 2-237167 | 9/1990 | Japan | 257/606 |
| 4-199577 | 7/1992 | Japan | . |
| 4-196358 | 7/1992 | Japan | . |
| 4-207083 | 7/1992 | Japan | . |
| 4-320067 | 11/1992 | Japan | . |
| 4-320066 | 11/1992 | Japan | . |
| 162251 | 11/1979 | Netherlands | 257/110 |

*Primary Examiner*—Sara W. Crane
*Assistant Examiner*—Courtney A. Bowers
*Attorney, Agent, or Firm*—Oblon, Spivak, McClelland, Maier & Neustadt

[57] ABSTRACT

In a breakover type surge protection device utilizing punch-through that comprises a second semiconductor region forming a first pn junction with a first semiconductor region, a third semiconductor region forming a second pn junction with the second semiconductor region and a fourth semiconductor region forming a third pn junction with the first semiconductor region at a place apart from the second semiconductor region, the second semiconductor region is constituted of a punch-through suppression region portion disposed to cover the corners of the third semiconductor region and a punch-through generation region portion disposed at a place where its thickness can be made uniform. Fabricating surge protection devices according to this configuration reduces variation among their breakover currents and hold currents and increases their surge absorption capacity.

18 Claims, 6 Drawing Sheets

SURGE PROTECTION DEVICE

BACKGROUND OF THE INVENTION

1. Field of the Invention

This invention relates to a surge protection device for protecting electric and electronic circuits from abnormally high voltages and currents caused by, for example, lightning, switching surges or the like.

2. Description of the Prior Art

A wide range of devices referred to as surge protection devices have been devised. Even the number of such devices that fall in the category of two-terminal surge protectors is considerable. The better of these are not limited to the function of clamping the voltage across the device terminals at a fixed breakdown voltage at the time of breakdown caused by occurrence of a surge (i.e. do not function simply as constant-voltage diodes). Instead they further exhibit negative characteristics when the device current that begins to flow at the time of the device breakdown increases to above the breakover current value. As a result, the voltage across the terminals after breakdown is shifted to a clamp voltage that is lower than the breakdown voltage. It therefore becomes possible to absorb large currents.

Among the surge protection devices of this type, some utilize an avalanche or Zenner breakdown mechanism, while others use the punch-through breakdown mechanism. Insofar as a general comparison goes, those using the punch-through breakdown mechanism are more advantageous in a number of ways. By providing a broad range of design options, they enable the breakdown voltage to be selected freely irrespective of impurity concentration, resistivity, thickness and the like of the semiconductor substrate used. They also allow various electrical properties such as junction capacitance and resistivity to be designed independently. From some time ago, the inventors have therefore focused considerable effort on the improvement of the breakover type surge protection device utilizing the punch-through principle. The results of this work, which was conducted from many different angles, are described, for example, in U.S. Pat. No. 5,083,185, U.S. Ser. No. 799,200, U.S. Ser. No. 799,075, Japanese Patent Appln. Public Disclosure Sho 61-259501, Sho 62-65382, Sho 62-65383, Hei 4-320066, Hei 4-320067, Hei 4-196358, Hei 4-199577 and Japanese Patent Appln. No. Hei 3-238950. The present invention takes still another approach to the improvement of the device utilizing the punch-though principle. As background information facilitating an understanding of the invention, the basic structure and operation of the punch-through type surge protection device will be explained with reference to FIG. 8.

The device has a first semiconductor region 1 constituted by a semiconductor wafer or a semiconductor substrate. The first semiconductor region 1 can be of either n or p conductivity type. In the illustrated device it is of n type. In view of various conditions involved in the fabrication of the individual device regions of a punch-through type device, it is somewhat more advantageous to use an n type substrate 1. A second semiconductor region 2 and a third semiconductor region 3 are successively formed on one principal surface of the semiconductor region 1, ordinarily by double impurity diffusion or selective ion-implantation. Since the second semiconductor region 2 has to form a pn junction with the first semiconductor region 1, it is selected to be of p type. In the case of a punch-through type device, it is preferable for it to be of a somewhat low concentration p type ($p^-$ type). The third semiconductor region 3 is of opposite conductivity type from the second semiconductor region 2 and forms a second pn junction with the second semiconductor region 2. In the illustrated case, it is therefore of n conductivity type. Since as explained later, however, the third semiconductor region 3 constitutes one end of the main device current path after breakdown, it preferably has high conductivity and, therefore, is preferable a high concentration ($n^+$) semiconductor region.

A fourth semiconductor region 4 is further formed on the other principal surface of the first semiconductor region 1 (the bottom surface in the drawing), so as to face the second semiconductor region 2. The fourth semiconductor region 4 is of the same conductivity type as the second semiconductor region 2 and forms a third pn junction with the first semiconductor region 1. In the illustrated case, a fifth semiconductor region 5 of opposite conductivity type from the fourth semiconductor region 4 (indicated by a chain line) forms a fourth pn junction with the fourth semiconductor region 4. The presence of the fifth semiconductor region 5 will, however, be ignored in the initial part of the explanation. If the fifth semiconductor region 5 is assumed not to be present, the fourth semiconductor region 4 does not have to be of $p^-$ type but can have an ordinary level of impurity concentration.

In the interest of brevity, the semiconductor regions 1, 2, 3, 4 (and 5) will be hereafter be referred to simply as "regions".

A first ohmic electrode $E_1$ is provided in common ohmic contact with the second region 2 and third region 3, via an opening in an insulation film 6, while a second ohmic electrode $E_2$ is provided in ohmic contact with the fourth region 4, via an opening in an insulation film 7. As shown schematically in FIG. 8, first and second device terminals $T_1$ and $T_2$ are lead out from the first and second ohmic electrodes $E_1$ and $E_2$, respectively. The device is connected with the circuit to be protected through these device terminals.

Structurally speaking, the surge protection device 10 shown in FIG. 8 is formed with the regions 1, 2, 3 and 4 stacked vertically in the thickness direction of the first region 1. Moreover, as will be clear from the explanation of the device's operation given later, the device current resulting from surge absorption flows in the thickness direction of the first region, between the third and fourth regions. The device can therefore be said to be of the vertical type. In contrast, although not illustrated, there are also prior art surge protection devices of the lateral type in which the fourth region 4 is situated on the same principal surface of the first region 1 as the second and third regions 2 and 3, side by side therewith. Since there is little difference in operating principle between the vertical and lateral devices, however, only the vertical structure will be explained here.

In the sectional configuration of FIG. 8, when a surge voltage arises across the first and second device terminals $T_1$, $T_2$ (first and second ohmic electrodes $E_1$ and $E_2$) at a relatively large magnitude and in such phase as to apply a reverse bias across the first pn junction between the first region 1 and the second region 2 (in the illustrated case, such that the first device terminal $T_1$ side becomes negative), the upper extremity of the depletion layer produced at the pn junction between the first and second regions reaches the third region 3, whereby punch-through is established. This is because when the region 2 is of low concentration $p^-$, type the depletion layer grows mainly toward the third region 3.

When punch-through occurs, minority carriers (from the viewpoint of the first region 1) are injected into the first region 1 from the fourth region 4 via the forward biased third pn junction. Since the injected minority carriers collect in the second region 2, device current begins to flow. The voltage at which this punch-through operation starts is designated as the breakdown voltage $V_{BR}$ on the voltage axis in the operating characteristics of these surge protection devices shown in FIG. 9.

Even if the second region 2 and the third region 3 should be shorted at their surfaces by mutual connection with the second device terminal $T_2$, following the start of minority carrier flow in this manner, once the device current begins to flow via the second region 2 and rises to the point that the product between itself and the resistance along the path thereof in the second region 2 (the voltage drop) becomes equal to the forward voltage at the pn junction formed between the second region 2 and the third region 3, the pn junction turns on so that minority carriers (from the viewpoint of the second region 2) are injected from the third region 3 into the second region 2. This injection of minority carriers into the second region 2 causes the device current flowing between the first and second device terminals $T_1$, $T_2$ to become even larger, as indicated in FIG. 9 by the portion of the characteristic curve which rises rapidly in the direction of the current axis. Since this in turn promotes the injection of minority carriers from the fourth region 4 into the first region 1, a positive feedback is obtained. Thus, as can be seen from the characteristic curve in FIG. 9, when the current flowing between the first and second device terminals $T_1$, $T_2$ becomes greater than the value indicated as the breakover current $I_{BO}$, the occurrence of positive feedback within the device manifests itself in the form of a negative resistance characteristic. As a result, the voltage across the first and second terminals $T_1$, $T_2$ shifts to a clamp voltage (or ON voltage) $V_P$ that is lower than the breakover voltage $V_{BO}$ at which breakover commenced and also lower than the breakdown voltage $V_{BR}$ at which punch-through first started. Therefore, the device is able to absorb large surge currents while holding down the amount of heat it generates.

The maximum current which the surge protection device can absorb across its first and second terminals $T_1$, $T_2$ is generally referred to as its "surge absorption capacity" $I_{PP}$. On the other hand, the minimum device current capable of maintaining the device in its on state after it has once turned on is called its "hold current" $I_H$. Stated differently, once the surge has subsided and a current equal to or larger than the hold current $I_H$ no longer flows through the device, the device automatically resets itself (turns off) to the state at the beginning of this explanation. Because of this, the hold current $I_H$ is also referred to as the "turn-off current."

As will be understood from the foregoing, the device can absorb surges of only one polarity. Specifically, it can absorb a surge only if it causes the first device terminal $T_1$ to become negative. It can therefore be called a "unipolar" surge protection device. To realize a "bipolar" surge protection device able to absorb surges of both polarities (irrespective of which of the first and second device terminals $T_1$ and $T_2$ becomes negative), it suffices to constitute the fourth region 4 to be substantially identical with the second region 2 (and thus have a somewhat low p⁻ type impurity concentration as shown in FIG. 8), form in the fourth region 4 a fifth region 5 (as indicated by the chain line) that is substantially identical with the third region 3, and short the surfaces of the fourth and fifth regions 4 and 5 with the second ohmic electrode $E_2$. In this specification, the terms "unipolar" and "bipolar" are used with regard to the polarity of the surges that a device is able to absorb. In the following description, therefore, the term "unipolar surge protection device" will be used to indicate surge protection devices able to absorb surges of only a specific single polarity and the term "bipolar surge protection device" will be used to indicate surge protection devices able to absorb surges of either polarity. This convention will be followed without use of any other mark or sign for emphasis.

In the bipolar surge protection device provided with the fifth region 5, if the surge polarity is reversed from that applied to the just-explained unipolar surge protection device capable of absorbing surges of only a specified polarity, specifically if the surge polarity becomes such that the first device terminal $T_1$ in the drawing becomes positive, the condition is substantially operationally equivalent to that in which the third region 3 is not present. Therefore, the fifth region 5 performs the function of the third region 3 explained above, the fourth region 4 performs that of the second region 2 described earlier, and the second region 2 performs that of the fourth region 4 described earlier. As a result, the voltage-vs-current characteristic curve becomes as shown in the third quadrant of FIG. 9 and, with respect to the origin, is symmetrical to the characteristic curve in the first quadrant. Insofar as the second and fourth regions 2 and 4 and the third and fifth regions 3 and 5 are fabricated to be identical as regards geometry, physical properties and electrical characteristics, the breakdown voltage $-V_{BR}$, breakover voltage $-V_{BO}$, breakover current $-I_{BO}$ and hold current $-I_H$ in the third quadrant will be the same in absolute value to those in the first quadrant.

The foregoing explanation applies not only to the illustrated vertical surge protection device but also, without substantial modification, to the lateral surge protection device in which the second region 2 and the fourth region 4 are provided at laterally separated positions on the same principal surface. In a still more practical configuration, in order to increase the surge absorption capacity $I_{PP}$, for example, a plurality of third regions 3 are provided side by side in the second region 2, as shown in FIG. 10. Where the aforementioned bipolar surge protection device is to be constituted, a plurality of the fifth region 5 are also provided in the fourth region 4. (When FIG. 10 is viewed in terms of the symbols in parentheses, it represents the structure on the fourth region 4 side.)

The prior art surge protection devices fabricated in accordance with the aforesaid basic structure are relatively free of problems insofar as they are constituted to have small surface area. However, when the area is enlarged so as to enhance the surge absorption capacity $I_{PP}$ or when an attempt is made to achieve more uniform current and characteristics by providing a plurality of third regions (and also fifth regions in the case of a bipolar surge protection device) in the manner of FIG. 10, it is frequently found that the surge absorption capacity $I_{PP}$ turns out to be smaller than expected and that the clamp voltage $V_P$ is not reduced as far as expected. Moreover, since leak paths occur in many of the devices, the production yield is not particularly high. An investigation of the cause of these problems provided the following knowledge.

It was discovered that in the devices in which the abovementioned problems arose geometric steps or irregularities as indicated by the phantom circles marked C in FIG. 10 occurred at the second and fourth regions 2 and 4 as a feature of their relationship with the third and fifth regions 3 and 5. In particular, when the third and fifth regions 3 and 5 were formed with respect to the second and fourth regions 2 and 4 by double impurity diffusion, the push-out effect of the later formed impurity regions 3 and 5 tended to cause the formation of the steps C in the second and fourth regions 2 and 4. Because of this, steps C frequently formed under the corner portions where the side and bottom surfaces of the second or fourth regions 2 and 4 meet. (For reasons of convenience, the figures show the bottom surfaces of the fifth regions 5 facing upward. Hereinafter in this specification "bottom surface" will be termed with respect to the third regions 3 to mean the surface thereof parallel to the principal surfaces of the first region 1 and in contact with the second region 2 and with respect to the fifth region 5 to mean the surface thereof parallel to the principal surfaces of the first region 1 and in contact with the fourth region 4.

In a surge protection device of the type using punch-through which is the topic of this discussion the breakdown voltage and other such ratings have been designed on the assumption that the thickness and impurity concentration of the regions in which punch-through occurs are constant throughout. Therefore, if the geometry of the second and fourth regions 2 and 4 should come to deviate from the specification values during some step in the fabrication process in the foregoing manner (particularly if non-uniformity should arise in the thickness of portions extending in the planar direction), there will naturally be lack of uniformity in the device current which flows at the time of surge absorption. This has made it impossible to achieve a large surge absorption capacity etc.

In actual practice, it has been found that unless an expensive, high-precision production system is configured, the same problems also occur for reasons other than the push-out effect. Particularly when the region in which punch-through is to occur is large, any unevenness arising at the time of impurity diffusion, unevenness in the pn junction depth and the like make it extremely difficult to achieve uniform punch-through throughout.

The present invention was accomplished in the light of the foregoing circumstances and has as its object to provide a surge protection device whose characteristics are caused to be extremely near design values by eliminating or reducing non-uniformity apt to occur in the second region (in the case of a bipolar surge protection device, in the second and fourth regions) in which a depletion layer grows at the time of punch-through associated with a prescribed breakdown operation.

For achieving this object, in a surge protection device having a basic sectional structure as shown in FIG. 8 or 10, the present invention configures the second region as a combination of two regions, namely a punch-through generation region portion in which growth of the depletion layer associated with the start of breakdown is positively promoted and a punch-through suppression region portion in which growth of the depletion layer is positively suppressed, disposes the punch-through suppression region portion to cover the corners of the third region, and disposes the punch-through generation region portion only between the flat facing portions of the third and first regions.

While the punch-through generation region portion and the punch-through suppression region portion are of the same conductivity type, they differ in that the punch-through generation region portion has a lower impurity concentration. In addition, the distinction between the two portions can be achieved by making the punch-through generation region portion thicker than the punch-through suppression region portion. Still further, the distinction can be achieved by imparting both the difference in impurity concentration and the difference in thickness.

The invention can further be applied to a surge protection device having a plurality of third regions. In this case, it suffices to provide each of the third regions with the aforesaid punch-through generation region portion and punch-through suppression region portion. Alternatively, it is possible to provide at least one third region with a punch-through generation region portion and to cover all of the other third regions with punch-through suppression region portions which cover the bottom surfaces and corners thereof (or enclose them).

The invention also defines the impurity concentration and size of the punch-through suppression region portion such that the increase in device current flowing between the first and second ohmic terminals after generation of punch-through in the punch-through generation region portion produces a voltage effect which is large enough to turn on the aforesaid pn junction.

The present invention can also be applied to improve the earlier described bipolar surge protection device, provided that configurational modifications are made in line with configuration of the bipolar device. More specifically, for improving a prior art surge protection device provided with a fourth region substantially the same as the second region and a fifth semiconductor region substantially the same as the third region so as to enable absorption of surges of either polarity, the second region is, as explained earlier, constituted as a combination of a punch-through generation region portion and a punch-through suppression region portion, and, in addition, the fourth region is also constituted as a combination of a punch-through generation region portion and a punch-through suppression region portion of higher impurity concentration in such manner that the punch-through suppression region portion covers the corners of the fifth region, the punch-through generation region portion being provided only between the flat facing portions of the fifth and first regions.

The various modifications relating to the punch-through generation region portion and the punch-through suppression region portion of the second region of the earlier described unipolar surge protection device can also be applied to the punch-through generation region portion and the punch-through suppression region portion of the fourth region of the bipolar surge protection device.

The above and other features of the present invention will become apparent from the following description made with reference to the drawings.

BRIEF DESCRIPTION OF THE DRAWINGS

FIG. 6 is a schematic view of an embodiment of the invention having Schottky junctions advantageously built in.

FIG. 8 is a schematic view of the basic structure of a prior art breakover-type surge protection device employing punch-through.

DESCRIPTION OF THE PREFERRED EMBODIMENTS

Figure 8:
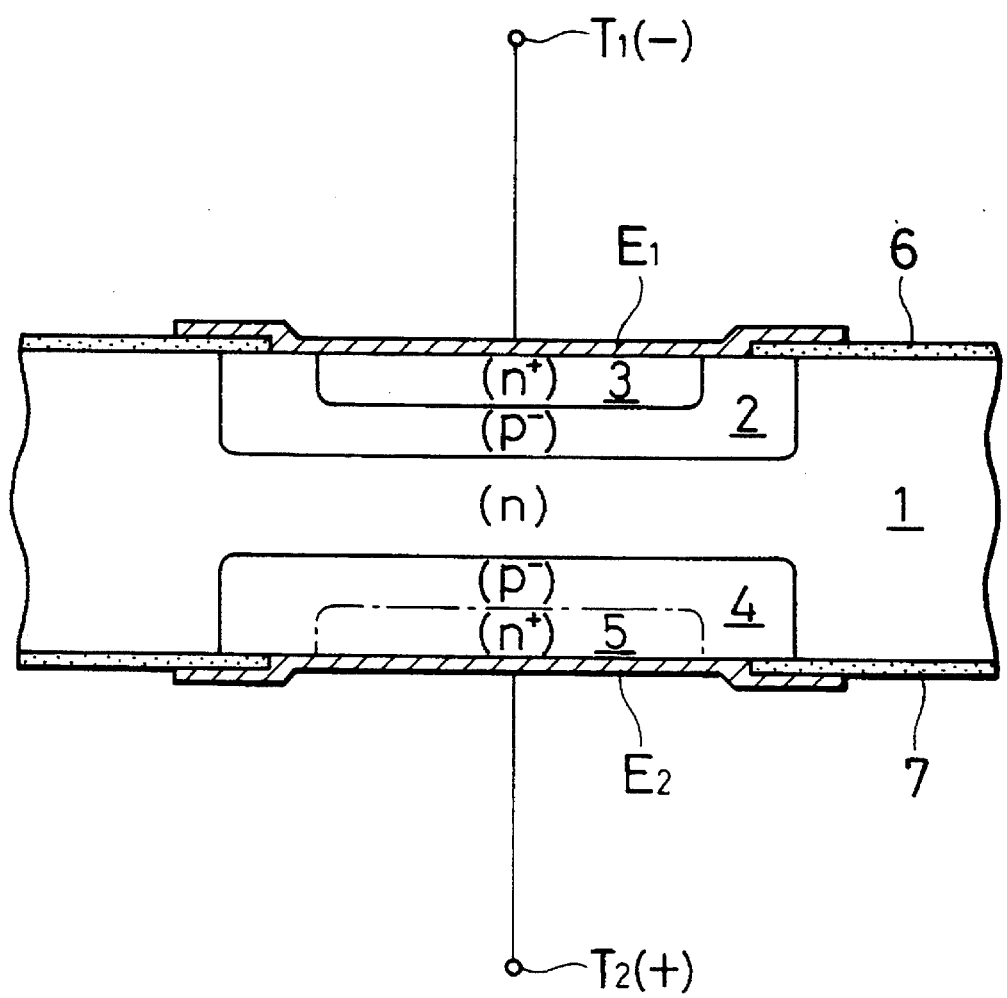
Figure 10:
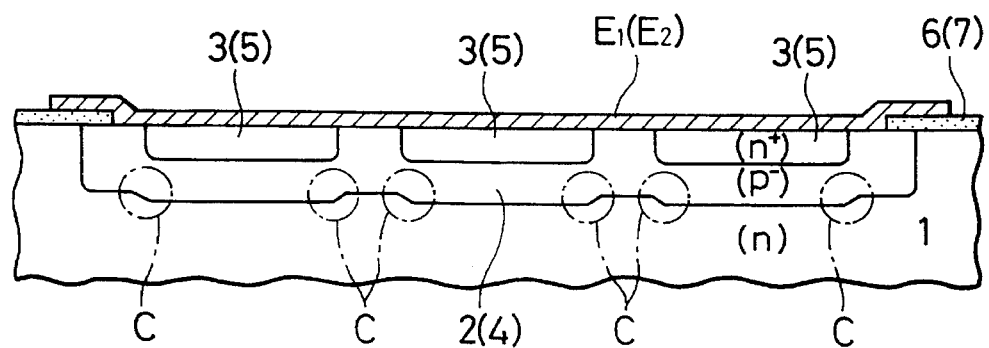
FIG. 10 is a schematic view for explaining the problems of the prior art surge protection device and the structural basis for the problems.

Embodiments of the invention will now be explained in detail with reference to the drawings. This invention relates to an improvement in the basic structure of the prior art surge protection device that was explained with reference to FIG. 8 and in the more realistic and practical structure of such a device that was explained with reference to FIG. 10. Constituent elements corresponding to those of the prior art devices explained will be assigned the same reference symbols in the explanation of the invention. In the case of the unipolar surge protection device lacking the fifth region 5 and capable of absorbing surges of only one polarity the improvement is in the structural relationship between the third region 3 and the second region 2, while in the case of the bipolar surge protection device provided with a fifth region 5 substantially the same as the third region 3 and a fourth region 4 substantially the same as second region 2 the improvement is also in the structural relationships between the fifth region 5 and the fourth region 4.

Figure 1:
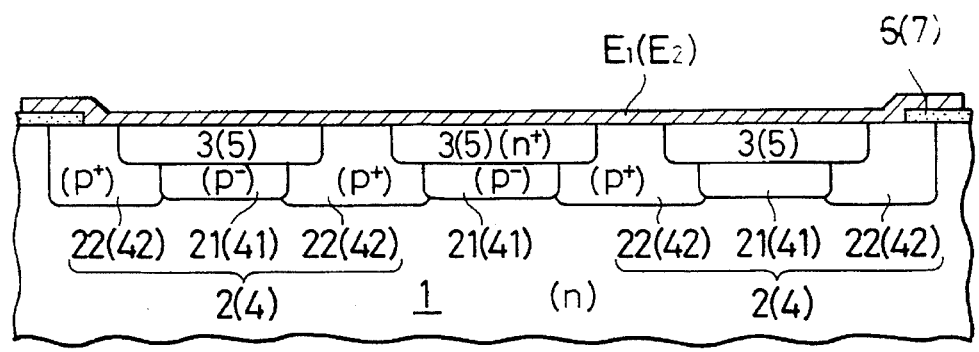
FIG. 1 is a schematic view of the essential pa of an embodiment of the surge protection device according to the invention.
Figure 9:
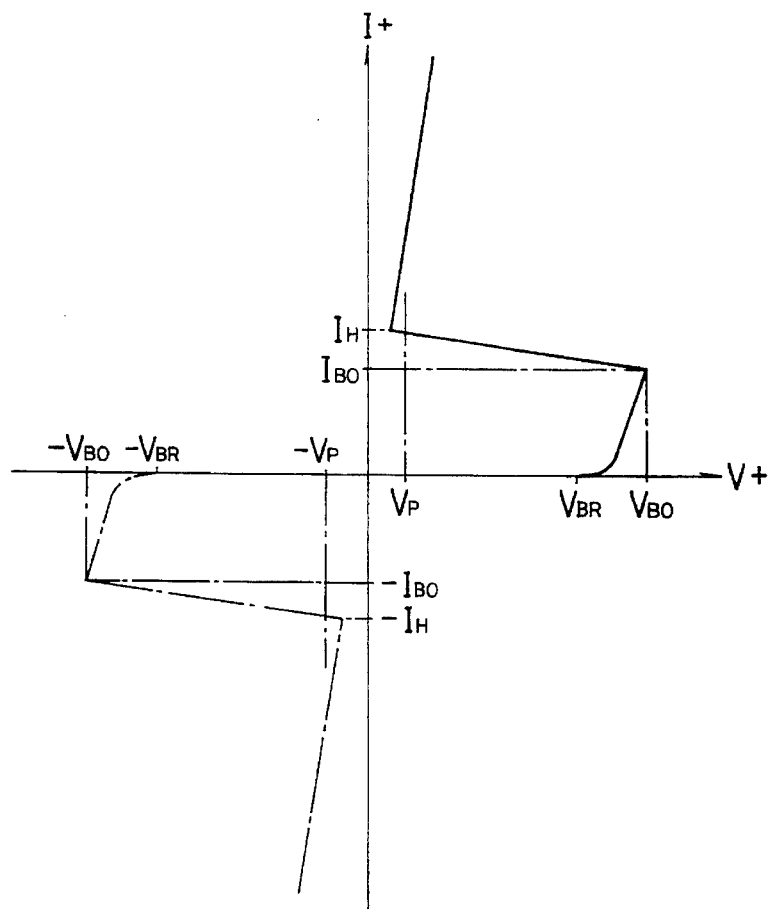
FIG. 9 is a graph showing the voltage-current characteristics of the prior art device of FIG. 8.

The first embodiment of the invention shown in FIG. 1 therefore shows only the improved portions. On the other hand, the explanation regarding portions not particularly requiring improvement will on occasion be made with reference to FIGS. 8 and 10. The same applies to the characteristic graph of FIG. 9. Moreover, while FIG. 1 focuses mainly on the relationship between the second region 2 and the third region 3, owing to the symbols in parentheses it can also, in the case of the improvement of the bipolar surge protection device, be read as indicating not only the relationship between the second region 2 and third region 3 but also that between the fourth region 4 and the fifth region 5. The following description will begin with an explanation of the relationship between the second region 2 and third region 3. In other words, the first part of the explanation can be understood to be the application of the invention to the improvement of the prior art unipolar surge protection device.

In the surge protection device of FIG. 1 illustrated as an embodiment of the invention, each second region 2 is constituted of two region portions 21, 22, which differ in type. Since, however, the two types of region portions 21, 22 are both constituent elements of the second region 2, they together form a first pn junction with the first region 1 (in the same way that the second region 2 was earlier explained to do so in a surge protection device of this type). Because of this, each is required to be of opposite conductivity type from the first region 1 (of p conductivity type in the illustrate example). They differ primarily in impurity concentration. In accordance with the invention, the first region portion 21 is given a relatively low concentration ($p^-$) of about the same level as required of the second region 2 in the prior art, while the second region portion 22 is given a high concentration ($p^+$).

As shown in FIG. 1, the high concentration ($p^+$) region portions 22 within the second regions 2 are provided to extend from the sides to the bottoms of the third regions 3 ... (three in the illustrated case) so as to cover the corners of the third regions 3. As a result of this arrangement, the corners of the third regions 3 ... can face the first region 1 only through the relatively high concentration region portions 22. The number of third regions 3 is not a feature of the invention and can be freely selected. It can be greater or smaller (as small as one) than shown in FIG. 1.

The relatively low concentration ($p^-$) region portions 21 within the second regions 2 are provided only between the flat facing portions of the third and first regions so as to realize uniform punch-through. In the illustrated case, since there are three third regions 3, there are also three relatively low concentration first region portions 21, one associated with each third region 3. In contrast, since each third region 3 has two corners in the sectional view shown, from this point of view there would be a total of six second region portions 22, one covering each of the six corners. However, the second region portion 22 which covers the left corner of the middle third region 3 is formed continuously with the second region portion 22 which covers the right corner of the third region 3 to the left thereof and the second region portion 22 which covers the right corner of the middle second region 2 is formed continuously with the second region portion 22 which covers the left corner of the third region 3 to right thereof, the actual number of region portions 22 is four.

Thus when each second region 2 is constituted of a first region portion 21 and a second region portion 22 in this way, if a surge of a polarity that reversely biases the pn junctions formed between the first and second regions is applied between the first and second device terminals $T_1$, $T_2$ (see FIG. 8) or the first and second ohmic electrodes $E_1$, $E_2$ (in which case the polarity of the first device terminal $T_1$ is negative), the depletion layer produced as a result grows mainly in the relatively low concentration ($p^-$) first region portions 21 of the second regions 2 and does not substantially grow the relatively high concentration ($p^+$) region portions 22. What this means is that when the voltage of the applied surge becomes high enough to be absorbed, the punch-through which, as was explained earlier in connection with the prior art, arises between the first region 1 and the third regions 3 at the beginning of the surge absorption mechanism proceeds only via the first region portions 21. If anything, the second region portions 22 tend to suppress the growth of the depletion layer. In other words, by establishing a difference in impurity concentration between the first region portions 21 and the second region portion 22, it is possible to cause the first region portions 21 of the second regions 2 to act as punch-through generation region portions 21 and the second region portions 22 to act as a punch-through suppression region portions 22.

Therefore, if, as illustrated, the punch-through generation region portions 21 are provided only at the bottom portions (excluding the corners) of the third regions 3 and, more specifically, are provided only between the highly flat facing surface portions of the third regions 3 and the first region 1, it becomes possible to eliminate at least one cause of the prior art drawback discussed earlier: the adverse effect on device characteristics of the steps C that tend to be produced in the vicinity of the corners of the third regions 3 at the time of fabrication owing to the push-out effect. This is because the thickness of the punch-through generation region portions 21 can be made extremely uniform throughout. In another way of looking at the invention, the punch-through generation region portions 21 correspond in essence to the second regions 2 of the conventional device provided only at the flat bottom surface portions of the third regions 3 and the corners are covered with the high concentration impurity regions 22 for positively suppressing punch-through.

As regards the device's breaking over with the help of the aforementioned positive feedback after punch-through between the first and third regions 1 and 3, at this time the region portions 22 also serve in the manner of conventional regions 2 as regions which pass device current (the flow of the minority carriers (from the viewpoint of the first region) injected into the first region) along the bottom and sides of the third regions (it being preferable, as will be explained later, for the second region portions 22 to play the main role in the development of a voltage drop for turning on the second pn junctions formed between the second regions and the third regions). In view of this, the present invention is best considered to reside in the division of the second region 2 into the first and second region portions 21, 22. It has in fact been ascertained that the operation following punch-through of a surge protection device to which this invention has been applied is the same as that explained in respect of prior art devices.

It is advantageous for the punch-through suppression region portions 22 to be thicker than the punch-through generation region portions 21, as shown in FIG. 1. The reason for this is that it mitigates the tendency for the electric field to concentrate at the corners of the third regions 3, which in turn helps to avoid undesirable avalanche yield from occurring at the corners prior to the intended punch-through. In addition, the presence of the region 22 prevents formation of an inverted layer on the surface of the punch-through generation region portions 21 and increases the minority carrier injection efficiency.

In addition, when the punch-through suppression region portions 22 is made thicker than the punch-through generation region portions 21, the difference in thickness (independently of the difference in impurity concentration) enables the punch-through generation region portions 21 to fulfill their anticipated function of producing punch-through primarily at the punch-through generation region portions 21 and prevents punch-through from occurring at the punch-through suppression region portions 22.

By imparting the punch-through generation region portions 21 and the punch-through suppression region portions 22 with different thicknesses and different impurity concentrations it is possible to constitute them as regions serving different functions.

Figure 2A:
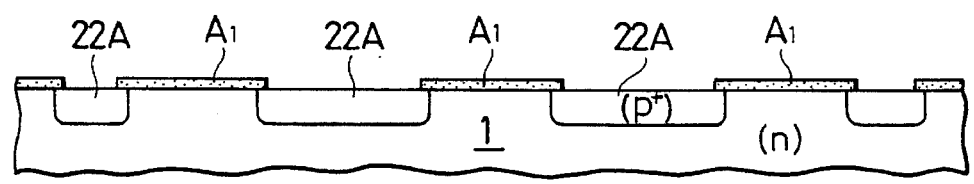
FIG. 2(A) illustrates an initial step in the fabrication of the second regions constituted by the second region portions according to the present invention.
Figure 2B:
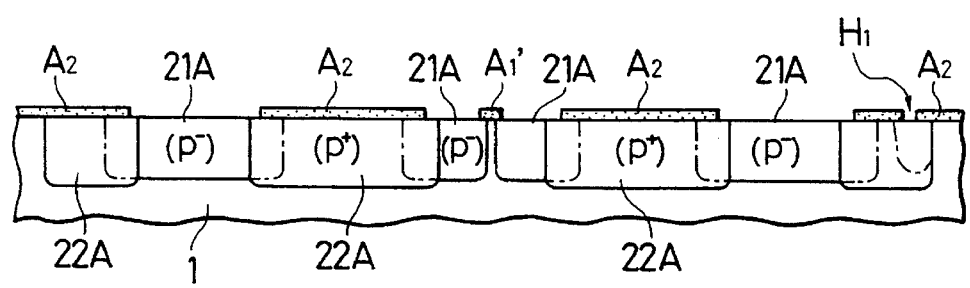
FIG. 2(B) illustrates the formation of the self-alignment mask on the surface of the first region for use in forming the punch-through generation region portions according to the present invention.
Figure 2C:
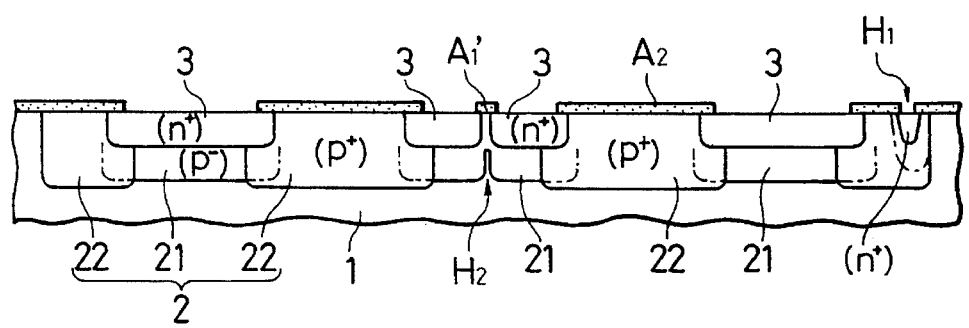
FIG. 2(C) illustrates the final structure produced according to the present invention which corresponds to the embodiment of FIG. 1.

FIGS. 2(A)–2(C) show a preferred process for advantageous fabrication of the second regions 2 and the first and second region portions 21, 22 according to this invention. First, as shown FIG. 2(A), a mask $A_1$ of silicon oxide, for example, is formed in a prescribed pattern on the surface of the first region 1 which is provided as n-type silicon and an appropriate impurity is deposited and driven in at open portions of the mask to form $p^+$ regions in the first region 1, at least some of which constitute $p^+$ starting regions 22A later to become punch-through suppression region portions 22.

Next, as shown in FIG. 2(B), after the mask $A_1$ has been removed, a self-alignment silicon oxide mask $A_2$ of prescribed pattern is formed for use in forming the punch-through generation region portions 21 and the third regions 3. In FIG. 2(B) there can also be seen residuals $A_1'$ of the first mask $A_1$ which escaped removal and pinholes $H_1$, both of which may cause defects in the lithography step. These will be discussed later.

An appropriate impurity is introduced through the openings of the mask $A_2$ for forming $p^-$ regions 21A destined to become the punch-through generation region portions 21. At this time, the thickness of the previously formed $p^+$ regions 22A increases to become greater than that of the $p^-$ regions 21A formed.

Next, a thin silicon oxide layer formed over the entire surface by the foregoing processes (but not illustrated) is removed with a buffered HF (BHF) agent or the like, whereafter relatively high concentration $n^+$ regions 3 are formed by self-aligned double diffusion so as to be appropriate as the third regions 3. Thus, as shown in FIG. 2(C), a structure corresponding to that of FIG. 1 is obtained. It should be noted, however, there are cases where the removing process using a BHF agent is not required depending on the kind of the impurity introducing method and/or the thickness of the silicon oxide layer.

Use of the self-aligned double diffusion technique simplifies the production process and also contributes to the achievement of high precision. In addition, since the introduction of $p^-$ impurity is invariably followed by the introduction of $p^-$ and $n^+$ impurity, even if lithographic defects such as shown in FIG. 2(B) should occur, they are either repaired or prevented from having a pronounced effect. For example, if a residual $A_1'$ of the first mask $A_1$ remains as illustrated, while to some degree it may, as shown in FIG. 2(C), cause in the finally fabricated device a crack-like configuration defect $H_2$ in the third region 3 or in the punch-through generation region portions 21 thereunder at the location concerned, this will not generally lead to a major problem in terms of voltage resistance, because no $n^+$ region 3 will be formed in this crack-like defect $H_2$ and this defect $H_2$ will be filled up by a depletion layer under the reverse bias condition. Similarly, even if, as shown in FIG. 2(B), a pin hole $H_1$ should form in mask $A_2$, since the self-alignment of the same mask $A_2$ having the same pinhole will cause the formation of both a $p^-$ region and an $n^+$ region in the pinhole region, voltage resistance can generally be secured at this location.

Various self-alignment techniques have heretofore been proposed. Impurities can be introduced not only by the self-aligned double diffusion technique but also by the selective ion-implantation technique. It is known that when a silicon oxide film having a silicon nitride film deposited thereon is used as a mask, the silicon oxide film under the silicon nitride film cannot grow in the driving-in process carried out in an atmosphere of oxygen and that since etchants usable for the two films differ from each other, etching can selectively be effected. In view of the knowledge described above, therefore, the third region 3 can be formed relative to the $p^-$ region portion 21A by the self-alignment if the processes of depriving the mask of a prescribed pattern of silicon nitride film alone and effecting the ion-implantation of an $n^+$ impurity through the remaining silicon oxide film are carried out. In this case, the aforementioned process of removing the silicon oxide film with a BHF agent can be omitted. The selective ion-implantation effected through the silicon oxide film can be applied to the $p^-$ region 21A which is the starting region for obtaining the punch-through generation region 21. If, after this selective ion-implantation, the $p^-$ impurity driving-in process is carried out in an atmosphere of nitrogen, for example, it is possible to suppress the growth of the silicon oxide film and, therefore, the ion implantation process for the formation of the n+ region 3 can be carried out immediately thereafter without undergoing the process of using a BHF agent.

In the foregoing explanation, if "second region 2" is read as "fourth region 4," "third region 3" as "fifth region 5," and the two types of regions constituting the second region 2, namely the "punch-through generation region portions 21" and the "punch-through suppression region portions 22," are read as "punch-through generation region portion 41 and punch-through suppression region portion 42 of the fourth region 4," and then the punch-through generation region portion 41 and the punch-through suppression region portion 42 of the fourth region 4 are formed in addition to the punch-through generation region portions 21 and the punch-through suppression region portions 22 of the second region 2, there will be obtained an invention-improved structure for the bipolar surge protection device explained earlier. An example of this structure is shown in FIG. 3.

Figure 3:
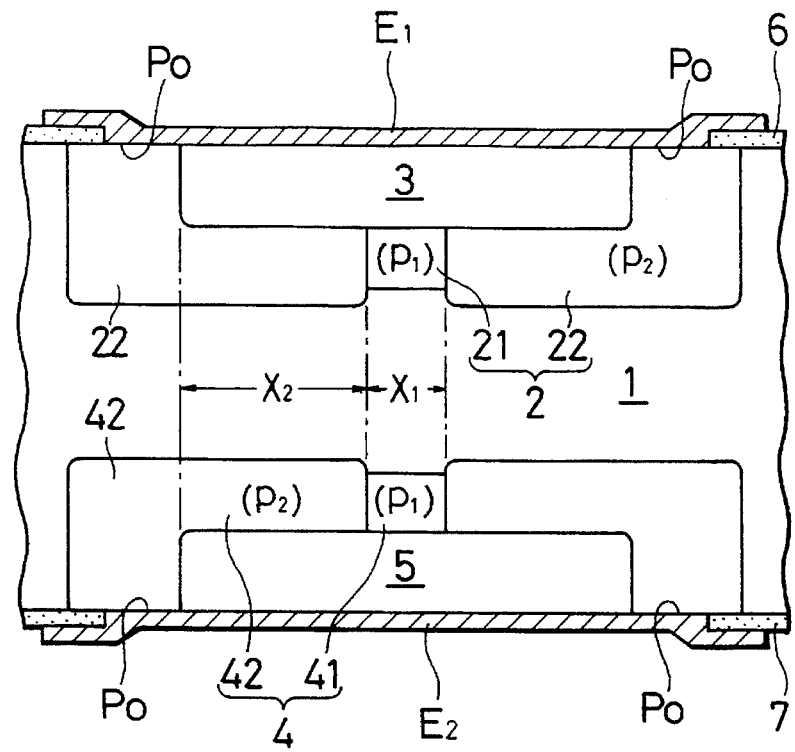
FIG. 3 is a schematic view of another embodiment of the invention.

In the surge protection device according to the invention shown in FIG. 3, the second region 2 consists of the punch-through generation region portions 21 and punch-through suppression region portions 22, and the fourth region 4 consists of the punch-through generation region portion 41 and the punch-through suppression region portion 42. In other words, FIG. 3 shows an embodiment obtained by applying the invention to a bipolar surge protection device, in particular to a vertical bipolar surge protection device. The fourth region 4 and the fifth region 5 face the second region 2 and the third region 3 across the first region 1 at the minimum possible separation in the thickness direction. What is more, the embodiment of FIG. 3 also incorporates other desirable features.

To be specific, in the surge protection device shown, the punch-through generation region portions 21 of the second region and the punch-through generation region portion 41 of the fourth region are provided to extend over only very short distances near the center of the regions where the third region 3 and the fifth region 5 face the first region 1. In other words, the pair of punch-through suppression region portions 22 of the second region 2 are not only present in the vicinity of the corners of the third region 3 but also extend a considerable distance along the bottom surface thereof so as to cover a major part of the bottom surface. Similarly, the pair of punch-through suppression region portions 42 of the fourth region 4 are not only present in the vicinity of the corners of the fifth region 5 but also extend over most of the bottom thereof. This arrangement is aimed at greatly reducing non-uniformity in the operation start voltage (breakdown voltage) by considerably reducing the areas of the portions 21 and 41 responsible for generating punch-through. The larger the area at which punch-through occurs, the greater becomes the difference that arises between the times at which punch-through starts at different points owing to planar thickness variation. This in turn leads to large differences in yield voltage among different devices of the same design. On the other hand, if the areas of the punch-through generation region portions 21, 41 whose function it is to generate punch-through are made small, the risk of the aforesaid problems arising is greatly reduced and, for all intents and purposes, the yield voltage can be accurately designed into the surge protection device merely by regulating the thicknesses of the punch-through generation region portions 21, 41.

On the other hand, the lateral width $X_1$ of the punch-through generation region portions 21, 41 in the sectional view of FIG. 3 should preferably not be very large. The reason for this is as follows. Since the punch-through region is in essence a high resistance region, the voltage drop along its path becomes large even at a slight current. Thus, the longer the current path, i.e. the larger the lateral width $X_1$ of the punch-through generation region portions 21, 41, the more susceptible the device becomes to undesirable breakover owing to the fact that even a "small surge" (defined to mean a surge whose voltage exhibits a large time differential value (dV/dt) but whose absolute voltage value is not large enough to require absorption) causes the third region 3 or the fifth region 5 to be forward biased.

To be specific, a junction capacitance $C_J$ can be expected to be present at each of the pn junctions that the punch-through generation region portion 21 of the second region 2 and the punch-through generation region portion 41 of the fourth region 4 form with the first region 1. Defining the area of each of the regions 21, 41 as S and the junction capacitance per unit area of the junctions as $C_0$ (so that $C_J=C_0 \cdot S$), then application of a surge with a voltage time differential value (dV/dt) will produce a transient current $i_t$ for charging one or the other of the junctions (which depending on the polarity of the surge), the magnitude of this transient current being $$i_t = C_0 \cdot S \cdot (dV/dt) \qquad (1)$$

Thus, if the dV/dt is large, it is possible for a fairly large transient current $i_t$ to be produced even by a surge with a small absolute voltage value.

In the sectional view of FIG. 3, therefore, if the distances between the ends of the punch-through generation region portions 21, 41 and the ends of the third region 3 and fifth region 5 are defined as $X_2$, the sheet resistance of each of the punch-through generation region portions 21, 41 as $\rho_1$, the sheet resistances of each of the region portions 22, 42 as $\rho_2$, and the current density of the current required for forward biasing the third region 3 or the fifth region 5 as J, and, further, if the structure is presumed to be such that the punch-through generation region portions 21, 41 are at the center of the bottoms of the third and fifth regions 3, 5 and, as seen the sectional view of FIG. 3, the first and second ohmic electrodes $E_1$, $E_2$ contact the surfaces of the second and fourth regions at opposite side portions $P_0$, $P_0$ of the third and fifth regions 3, 5, then the current component which passes through the center of the punch-through generation region portion 21 or 41 and also through the portions $P_0$ of either the first ohmic electrode $E_1$ or the second ohmic electrode $E_2$ will, as regards the punch-through generation region portions 21, 41, become the current component traversing the longest distance. Since the thicknesses of the third and fifth regions 3, 5 can be ignored, the distance that has to be taken into consideration regarding this current which traverses the longest distance is that obtained by adding half of the sectional length of the punch-through generation region portion 21, 41 ($X_1/2$) and the distance $X_2$ over which the current flows along either the right or left side of the bottom surface of the punch-through suppression region portion 22, 42, namely the sum ($X_2+X_1/2$). The condition under which the third region 3 or the fifth region 5 is not forward biased as the result of punch-through when half the sectional width of the extremely high resistance punch-through suppression region portion 22, 42 is defined as $X_1/2$ can be expressed as $$\int_0^{X_2} \rho_2 \cdot J \cdot x \cdot dx \geqq \int_0^{X_1/2} \rho_1 \cdot J \cdot x \cdot dx \qquad (2)$$

When this is solved for the relationship between the distances $X_1$, $X_2$, Equation 3 is obtained. If the sectional dimension ratios among the punch-through generation region portions 21, 41, punch-through suppression region portions 22, 42 and the third and fifth regions 3, 5 are determined on the basis of this equation, a device with high dV/dt resistance can be obtained.

$$X_2 \geqq \sqrt{\frac{\rho_1}{\rho_2}} \cdot (X_1/2) \qquad (3)$$

In the case of configuring a unipolar surge protection device, the considerations based on Equation 3 need be applied only to the punch-through generation region portion 21 and the punch-through suppression region portion 22 of the second region. In cases in which a plurality of third regions 3 and fifth regions 5 are configured, Equation 3 can be used to determine the dimensional relationship between the punch-through generation region portion 21, 41 and the punch-through suppression region portion 22, 42 of each of the third regions 3 and fifth regions 5.

Designing the punch-through generation region portion 21 (41) and the punch-through suppression region portion 22 (42) in light of the dimensional considerations explained above is also effective for purposes other than coping with the dV/dt. This is particularly true when consideration is further given to the impurity concentration of the punch-through suppression region portion 22 (42). Specifically, when consideration to one or both of these points is used to ensure that punch-through occurs only at the limited area of the punch-through generation region portion 21 (41) and that the ensuing forward bias of the third region 3 (fifth region 5), which dictates the breakover characteristics, is obtained from the voltage drop produced by the current passing through the punch-through suppression region portion 22 (42), makes it possible to secure a very high degree of design freedom and good reproducibility even in cases where it would otherwise be impossible to obtain uniform punch-through when the area becomes too large owing to problems to some degree in fabrication precision.

In cases where a plurality of the third regions 3 (fifth regions 5) are formed as shown in FIG. 1, the idea of limiting the punch-through generation region portions 21 (41) to a small area can also be applied to a configuration in which a punch-through generation region portion 21 (41) is not provided for each of the third regions 3 (fifth regions 5) but only a single punch-through generation region portion 21 (41) is provided for one of the third regions 3 (fifth regions 5) and the bottom surfaces of the other third regions 3 (fifth regions 5) are completely covered (enclosed) along with their corners by punch-through suppression region portions 22 (42). This configuration also has been found to be effective. What is important to note here is that it is possible to obtain a surge protection device exhibiting characteristics close to the design values by limiting the occurrence of punch-through to a single local region 21 (41) of such small area as to substantially eliminate the possibility of non-uniformity owing to the production process and ensuring that the ensuing forward biasing of the third regions (fifth regions 5) progressively spreads in the lateral (planar) direction. (As mentioned earlier, the foregoing forward biasing of the third regions 3 (5) that starts at one portion and then spreads progressively to others is a very fast phenomenon accompanied by positive feedback. Because of this, even if the entire surface area of the third regions 3 (fifth regions 5) is not forward biased exactly simultaneously, the time required for the device to turn on via the negative resistance characteristic portion appearing in the characteristic curve is still very short and the device does not suffer a severe setback in its rapid response time.

Figure 4:
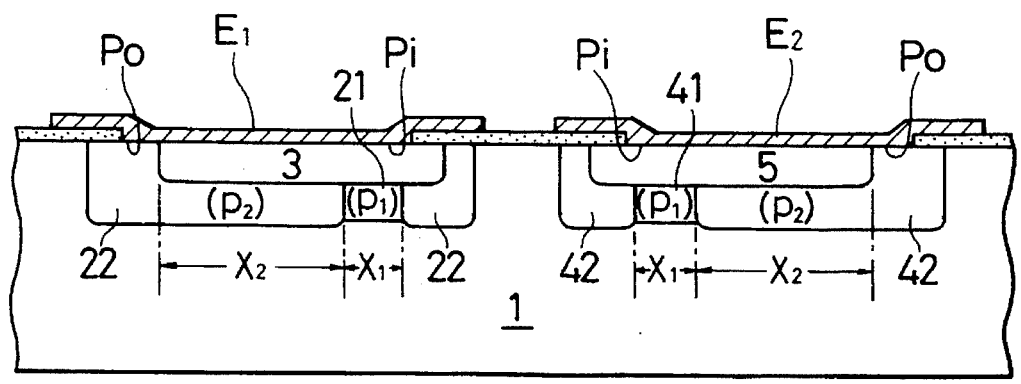
FIG. 4 is a schematic view of a laterally configured surge protection device according to the invention.

FIG. 4 shows another embodiment of the invention. Like the embodiment of FIG. 3, this embodiment also relates to a surge protection device capable of absorbing surges appearing in either polarity across the first ohmic electrodes $E_1$, $E_2$. However, it is configured as a lateral device. It is similar to the vertical device in the points that punch-through generation region portions 21, 41 associated with the second region 2 and the fourth region 4 extend along the bottom surfaces of the third and fifth regions 3, 5, the sectional width $X_1$ is limited to a short area portion, and the punch-through suppression region portions 22, 42 cover not only the corners but also bottom surface portions of the third and fifth regions 3, 5. As explained earlier, these are desirable features. The points of difference are that the punch-through generation region portions 21, 41 are not located at the middle of the third and fifth regions 3, 5 but at positions closer to each other and that as indicated by the symbols $P_0$ the first and second ohmic electrodes $E_1$, $E_2$ have their farther ends in contact with both the third region 3 and the second region 2 (or the punch-through suppression region portion 22) and with both the fifth region 5 and the fourth region 4 (or the punch-through suppression region portion 42) but, as indicated by the symbols $P_i$ have their closer ends in contact with only the third region 3 and the fifth region 5.

The significance of this offset placement of the first and second ohmic electrodes $E_1$, $E_2$ will be explained.

When the polarity of an applied surge is such that the first ohmic electrode $E_1$ becomes negative, punch-through occurs in the punch-through generation region portion 21 of the second region 2. At this time minority carriers (holes in the case under discussion) are first injected from the fourth region 4 into the first region 1 and the hole current passes through the second region 2 (including the punch-through suppression region portion 22) to the first ohmic electrode $E_1$. If the path of this hole current is indefinite, it is impossible to ascertain the magnitude of the hole current which continues to flow until the voltage drop becomes equal to the forward biasing voltage of the second pn junction formed by the second region 2 and the third region 3 and, therefore, impossible to ascertain the breakover current $V_{BO}$. Because of this, the controllability and stability of the hold current $I_H$ is degraded. In the case of a surge of the opposite polarity, the same problem arises in connection with the minority carrier current (from the viewpoint of the first region 1) which is supplied from the second region 2 to the first region 1 following the occurrence of breakthrough in the punch-through generation region portion 41 of the fourth region 4.

However, if as shown in FIG. 4, the first ohmic electrode $E_1$ makes contact with the second region 2 only at the end $P_0$ farther from the fourth region 4, then when a surge causing the first ohmic electrode $E_1$ to become negative is applied the minority carrier current (from the viewpoint of the first region 1) injected into the first region 1 from the fourth region 4 will be so restricted as to always flow to the portion $P_0$ of the first ohmic electrode $E_1$ after passing along substantially the full lateral length of the bottom surface of the third region 3. In exactly the same way, when a surge causing the second ohmic electrode $E_2$ to be come negative is applied, the minority carrier current (from the viewpoint of the first region 1) injected into the first region 1 from the second region 2 will always flow to the portion $P_0$ of the second ohmic electrode $E_2$ after passing along the bottom surface of the fifth region 5. Thus, the current path is definite in either case. This means that the controllability and stability of the breakover current $V_{BO}$ and the hold current $I_H$ are enhanced. This was confirmed by experiments conducted by the inventors. It was also found that the surge absorption capacity increases approximately in proportion to the device area. The offset configuration of the ohmic electrodes can also be applied to provide a unipolar surge protection device according to the invention. It suffices to adopt the offset configuration with respect to at least the first ohmic electrode $E_1$ attached to the surfaces of the second and third regions.

Similarly to what was explained earlier with respect to FIG. 3, for increasing dV/dt resistance, it is preferable to comply with the following Equation 4 in designing the dimensional relationship between the punch-through generation region portion 21 and the punch-through suppression region portion 22 of the second region 2 in the case of a unipolar surge protection device and, in addition, in designing the dimensional relationship between the punch-through generation region portion 41 and the punch-through suppression region portion 42 in the case of a bipolar surge protection device.

$$X_2 \gtreqqless \sqrt{\frac{\rho_1}{\rho_2}} \cdot X_1 \quad (4)$$

Equation 4 differs form the earlier Equation 3 in that the right side includes the term $X_1$ in place of the term $(X_1/2)$. This is because, differently than from in the vertical configuration, the offsetting of the ohmic electrodes requires the carrier current to traverse the whole lateral width of the punch-through generation region portion 21 or the punch-through generation region portion 41. As was explained earlier, the limiting of the punch-through generation region portions 21, 41 to a small area helps to compensate for less than perfect the fabrication accuracy.

Figure 5:
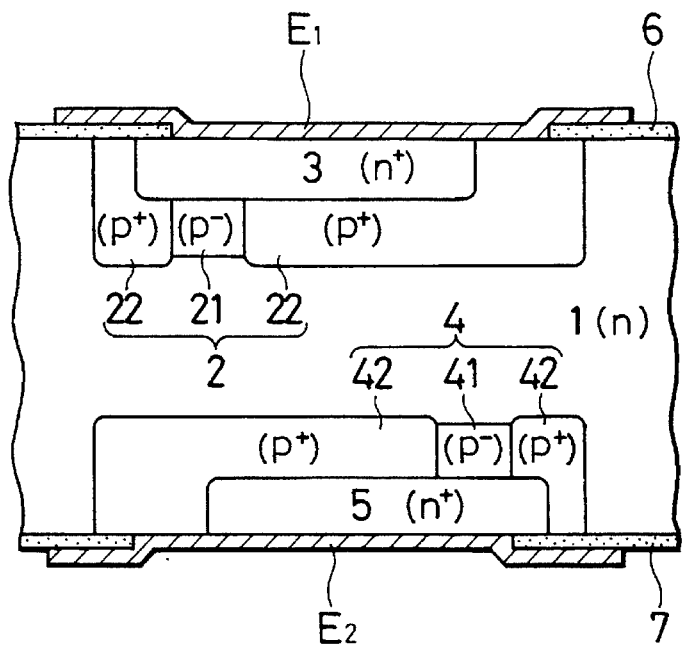
FIG. 5 is a schematic view of an embodiment of the invention in which a special structural feature used in the fabrication of the lateral surge protection device of FIG. 4 is applied to a vertical surge protection device.

As shown in FIG. 5, the offset configuration relating to the punch-through generation region portions 21, 41 and the first and second electrodes $E_1$, $E_2$ can also be applied to the vertical surge protection device. In the specific case of a surge protection device which is both vertical and bipolar, it suffices to offset the punch-through generation region portion 21 of the second region 2 and the punch-through generation region portion 41 of the fourth region 4 laterally with respect to each other as viewed in section, i.e. as shown in FIG. 5. At the same time, it is preferable for the portion $P_0$ where the first ohmic electrode $E_1$ contacts surfaces of both the second region 2 and the third region 3 and the portion $P_0$ where the second ohmic electrode $E_2$ contacts the surfaces of both the fourth region 4 and the fifth region 5 to be offset laterally from each other. The reason for this is the same as that explained with respect to the embodiment of FIG. 4, namely that by making the path of the carrier current definite it enhances the controllability and stability of the breakover current $V_{BO}$ and the hold current $I_H$, whereby it becomes possible to secure good surge absorption capacity. Equation 4 can also be applied for designing the dimensional relationship between the punch-through generation region portions 21, 41 and the punch-through suppression region portions 22, 42.

Figure 6:
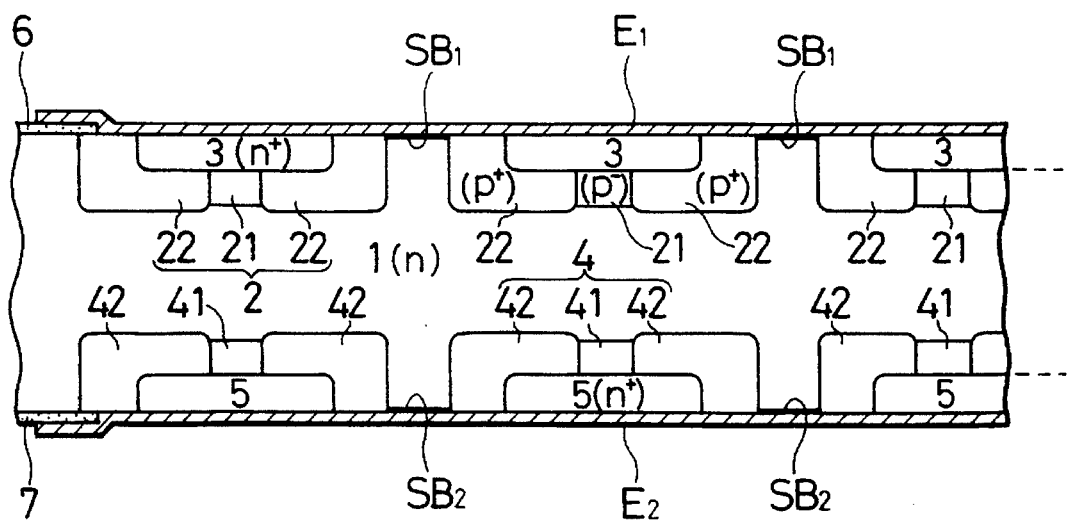

FIG. 6 shows an embodiment constituted by forming in one and the same first region 1 a plurality of unit structures each the equivalent of the vertical surge protection device capable of absorbing bipolar surges shown in FIG. 3. The exception to the similarity is that a single first ohmic electrodes $E_1$ and a single second ohmic electrode $E_2$ are provided as common electrodes for all of the unit structures. This means that even where, in the case of a unipolar surge protection device, a plurality of third regions 3 are not provided in a common second region 2 or, in the case of a bipolar surge protection device, a plurality of fifth regions 5 are not further provided in a common fourth region 4, a second region 2 (fourth region 4) can be provided with respect to each of a plurality of third regions 3 (fourth regions 4).

What is more, FIG. 6 further shows how Schottky junctions can be advantageously used for further improving the performance of the surge protection devices in accordance with the foregoing embodiments of the invention. To be specific, there are provided first Schottky junctions $SB_1$ which are electrically connected with the first ohmic electrode $E_1$ and form first Schottky barriers between the first ohmic electrode $E_1$ and the first region 1 and second Schottky junctions $SB_2$ which are electrically connected with the second ohmic electrode $E_2$ and form second Schottky barriers between the second ohmic electrode $E_2$ and the first region 1. In the illustrated case, a first Schottky junction $SB_1$ is provided between each adjacent pair of second regions 2 and a second Schottky junction is provided between each adjacent pair of fourth regions 4. In a device having these Schottky junctions, when a surge of a polarity causing the first ohmic electrode $E_1$ to become negative is applied so that punch-through should occur via the punch-through generation region portions 21 of the second regions 2 for absorbing the same, it is possible, even before the punch-through takes place, for a carrier current for charging the junction capacitance $C_J$ of the pn junction formed between the second region 2 and the first region 1 to be rapidly passed through the second Schottky junctions $SB_2$ connected with the second ohmic electrode $E_2$. When a surge of the opposite polarity is applied, it is possible for a carrier current for charging the junction capacitance $C_J$ of the pn junction formed between the fourth region 4 and the first region 1 to be rapidly passed through the first Schottky junctions $SB_1$ connected with the first ohmic electrode $E_1$. As a result, the aforesaid dV/dt resistance can be greatly increased. Moreover, during application of a surge which causes the first ohmic electrode $E_1$ to become negative, the first Schottky junctions, which do not operate at such times, are reverse biased and thus have no effect on the basic operating mechanism of the surge protection device after the occurrence of punch-through. Likewise, during application of a surge which causes the second ohmic electrode $E_2$ to become negative, the second Schottky junctions, which do not operate at such times, are reverse biased and thus have no effect on the basic operating mechanism of the surge protection device after the occurrence of punch-through. The Schottky junction $SB_2$ or $SB_1$ which is involved in the charging of the junction capacitance $C_J$ does not create any problem either since after the third region 3 or the fifth region 5 turns on the current passes mainly there the turned-on region. (For detailed information regarding the utilization of Schottky junctions in this manner see the technology disclosed by the inventors in U.S. Ser. No. 799,200 and Japanese Patent Application Public Disclosure No. Hei 4-196358.)

Where a unipolar surge protection device is to be configured, if the fourth region 4 is formed as a monotonous region of monotonous impurity concentration for absorbing only surges of the polarity which causes the first ohmic electrode $E_1$ to become negative, it suffices to leave only the second Schottky junctions $SB_2$, while if the second region 2 is formed as a monotonous region of monotonous impurity concentration for absorbing only surges of the polarity which causes the second ohmic electrode $E_2$ to become negative, it suffices to leave only the Schottky junctions $SB_1$.

Figure 7:
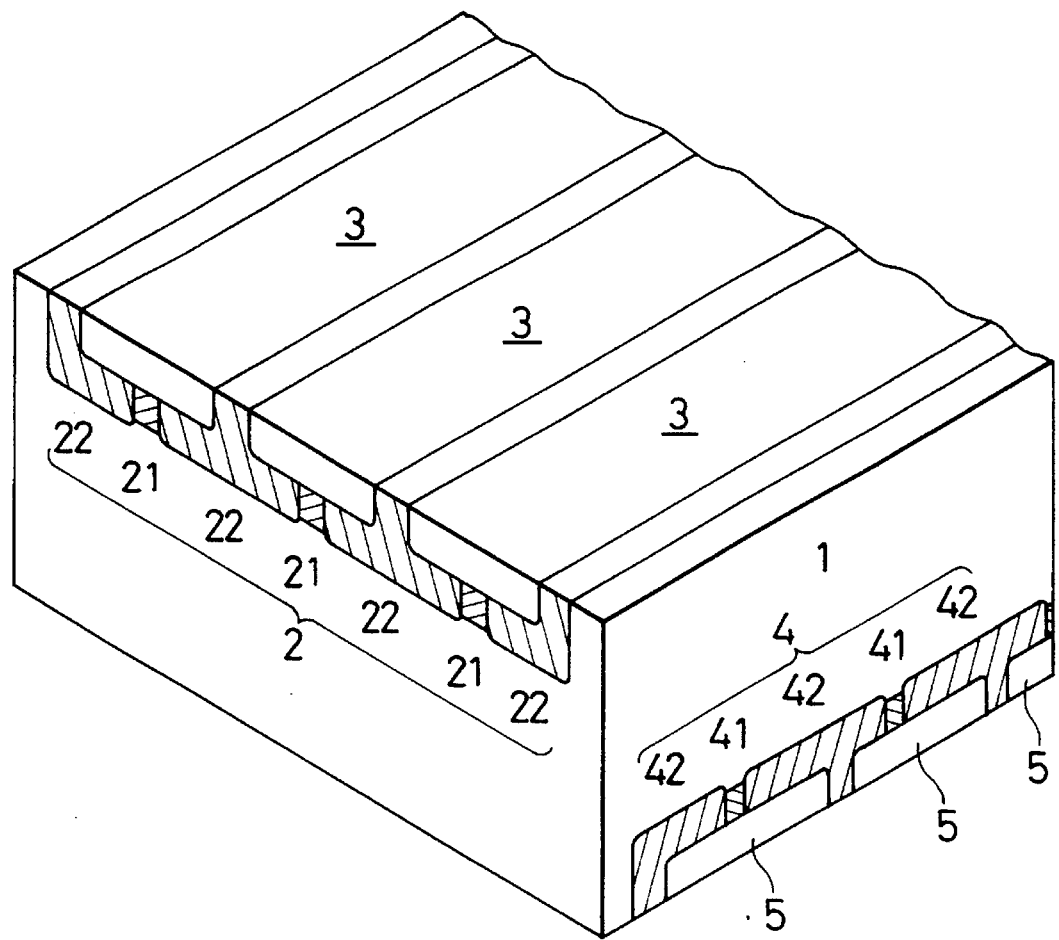
FIG. 7 is a schematic view of an embodiment of the invention in which a plurality of third regions and a plurality of fifth regions are arranged so as to intersect obliquely or perpendicularly in planar projection.

When a bipolar surge protection device having a plurality of regions 3 and 5 is to be fabricated according to the invention, it is preferable, as shown in FIG. 7, for the groups of regions provided on the opposite principal surfaces of the first region 1 to be aligned so as to intersect with each other when viewed in planar projection, and more preferable so as to intersect at right angles. While FIG. 7 shows a section of a configuration in which a plurality of third regions 3 are provided in a common second region 2 and a plurality of fifth regions 5 are provided in a common fourth region 4, this obliquely or perpendicularly intersecting relationship can also be used to advantage in any of the aforesaid embodiments having a plurality of third and fifth regions 3 and 5 and/or of second and fourth regions 2 and 4. More detailed information regarding this obliquely or perpendicularly intersecting configuration is disclosed in Japanese Patent Appln. No. Hei 3-238950. This layout further enhances the uniformity of the carrier current in the thickness direction of the first region 1 and also improves the controllability of the characteristic parameters and the surge absorption capacity.

The foregoing description implies that when a bipolar surge protection device having a plurality of third and fifth regions 3 and 5 is fabricated, the third regions 3 and the fifth regions 5 are equal in number and the same in terms of area and physical properties. However, in special cases these regions can conceivably be intentionally made different in number, area or the like. In such cases, the absolute values of the currents and voltages appearing in the first and third quadrants of the current-vs-voltage characteristic graph of FIG. 9 will be different.

In surge protection devices that utilize punch-through and are of the breakover type, the present invention substantially mitigates the influence of problems with production process precision and the push-out effect that accompanies impurity diffusion. It thus makes it possible to obtain a breakover current value $I_{80}$ and a hold current value $I_H$ which are very close to the design values and ensures that an increase in device area produces a commensurate increase in the surge absorption capacity $I_{PP}$. Most importantly, variation in characteristics among different devices is reduced.

In addition, the punch-through generation region portion and the region which forms a pn junction with the punch-through generation region portion (the third region or the fifth region) can be formed using the self-alignment technique. Since the use of this technique makes it possible to correct for mask remnants, pinholes and other defects occurring in the lithography process or to reduce the effect of such defects, a major increase in production yield can also be realized.

What is claimed is:

1. A surge protection device comprising a first semiconductor region, a second semiconductor region forming a first pn junction with the first semiconductor region, at least one third semiconductor region facing the first semiconductor region across the second semiconductor region and forming a second pn junction with the second semiconductor region, a fourth semiconductor region forming a third pn junction with the first semiconductor region at a place apart from the second semiconductor region, the second semiconductor region being comprised of a punch-through generation region portion and a punch-through suppression region portion, the punch-through suppression region portion being disposed to cover corners of the at least one third semiconductor region, the punch-through generation region portion being disposed only between flat facing portions of the at least one third semiconductor region and the first semiconductor region, a first ohmic electrode disposed in common ohmic contact with surfaces of the second and at least one third semiconductor regions, and a second ohmic electrode disposed in ohmic contact with the fourth semiconductor region;

wherein application across the first ohmic electrode and the second ohmic electrode of a surge of a polarity causing the first pn junction to be reverse biased causes a depletion layer to grow in the punch-through generation region portion of the second semiconductor region and reach the at least one third semiconductor region to cause punch-through and initiate breakdown operation between the first and at least one third semiconductor regions, whereafter current flowing between the first and second ohmic electrodes increases to produce in the second semiconductor region a voltage drop which turns on the second pn junction and causes the surge protection device to exhibit a breakover characteristic, wherein the punch-through generation region portion and the punch-through suppression region portion constituting the second semiconductor region are of the same conductivity type but an impurity concentration of the punch-through generation region portion is lower than that of the punch-through suppression region portion, whereby the punch-through generation region portion permits punch-through to occur between the first and at least one third semiconductor regions and the punch-through suppression region portion suppresses the occurrence of punch-through between the first and at least one third semiconductor regions.

2. A surge protection device comprising a first semiconductor region, a second semiconductor region forming a first pn junction with the first semiconductor region, at least one third semiconductor region facing the first semiconductor region across the second semiconductor region and forming a second pn junction with the second semiconductor region, a fourth semiconductor region forming a third pn junction with the first semiconductor region at a place apart from the second semiconductor region, the second semiconductor region being comprised of a punch-through generation region portion and a punch-through suppression region portion, the punch-through suppression region portion being disposed to cover corners of the at least one third semiconductor region, the punch-through generation region portion being disposed only between flat facing portions of the at least one third semiconductor region and the first semiconductor region, a first ohmic electrode disposed in common ohmic contact with surfaces of the second and at least one third semiconductor regions, and a second ohmic electrode disposed in ohmic contact with the fourth semiconductor region;

wherein application across the first ohmic electrode and the second ohmic electrode of a surge of a polarity causing the first pn junction to be reverse biased causes a depletion layer to grow in the punch-through generation region portion of the second semiconductor region and reach the at least one third semiconductor region to cause punch-through and initiate breakdown operation between the first and at least one third semiconductor regions, whereafter current flowing between the first and second ohmic electrodes increases to produce in the second semiconductor region a voltage drop which turns on the second pn junction and causes the surge protection device to exhibit a breakover characteristic, wherein the punch-through generation region portion and the punch-through suppression region portion constituting the second semiconductor region are of the same conductivity type but a thickness of the punch-through generation region portion is smaller than that of the punch-through suppression region portion at the corners of the at least one third semiconductor region, whereby the punch-through generation region portion permits punch-through to occur between the first and at least one third semiconductor regions and the punch-through suppression region portion suppresses the occurrence of punch-through between the first and at least one third semiconductor regions.

3. A surge protection device comprising a first semiconductor region, a second semiconductor region forming a first pn junction with the first semiconductor region, at least one third semiconductor region facing the first semiconductor region across the second semiconductor region and forming a second pn junction with the second semiconductor region, a fourth semiconductor region forming a third pn junction region being comprised of a punch-through generation region portion and a punch-through suppression region portion, the punch-through suppression region portion being disposed to cover corners of the at least one third semiconductor region, the punch-through generation region portion being disposed only between flat facing portions of the at least one third semiconductor region and the first semiconductor region, a first ohmic electrode disposed in common ohmic contact with surfaces of the second and at least one third semiconductor regions, and a second ohmic electrode disposed in ohmic contact with the fourth semiconductor region;

wherein application across the first ohmic electrode and the second ohmic electrode of a surge of a polarity causing the first pn junction to be reverse biased causes a depletion layer to grow in the punch-through generation region portion of the second semiconductor region and reach the at least one third semiconductor region to cause punch-through and initiate breakdown operation between the first and at least one third semiconductor regions, whereafter current flowing between the first and second ohmic electrodes increases to produce in the second semiconductor region a voltage drop which turns on the second pn junction and causes the surge protection device to exhibit a breakover characteristic, wherein the punch-through generation region portion and the punch-through suppression region portion constituting the second semiconductor region are of the same conductivity type but an impurity concentration of the punch-through generation region portion is lower and a thickness thereof smaller than the impurity concentration and the thickness of the punch-through suppression region portion, whereby the punch-through generation region portion permits punch-through to occur between the first and at least one third semiconductor regions and the punch-through suppression region portion suppresses the occurrence of punch-through between the first and at least one third semiconductor regions.

4. A surge protection device according to any of claims 1 to 3, wherein the at least one third semiconductor region is constituted as a plurality of separate third semiconductor regions, the punch-through suppression region portion of the second semiconductor region is constituted as a plurality of punch-through suppression region portions for covering the corners of the plurality of third semiconductor regions, and the punch-through generation region portion of the second semiconductor region is constituted as plurality of punch-through generation region portions one of which is disposed between each third semiconductor region and the first semiconductor region at said flat facing portions thereof.

5. A surge protection device according to any of claims 1 to 3, wherein the at least one third semiconductor region is constituted as a plurality of third semiconductor regions, the punch-through generation region portion of the second semiconductor region is constituted as at least one punch-through generation region portion disposed between at least one third semiconductor region and the first semiconductor region at said flat facing portions thereof, and the punch-through suppression region portion of the second semiconductor region is constituted as a plurality of punch-through suppression region portions for covering the corners of the plurality of third semiconductor regions and bottom surfaces of the third semiconductor regions not provided with the punch-through generation region portion.

6. A-surge protection device according to any of claims 1 to 3, wherein impurity concentration and dimensions of the punch-through suppression region portion are determined such that a voltage drop produced by the increased current between the first and second ohmic electrodes after the occurrence of punch-through in the punch-through generation region portion has a value which turns on the second pn junction.

7. A surge protection device according to claim 4, wherein impurity concentration and dimensions of the punch-through suppression region portion are determined such that a voltage drop produced by the increased current between the first and second ohmic electrodes after the occurrence of punch-through in the punch-through generation region portion has a value which turns on the second pn junction.

8. A surge protection device according to claim 5, wherein impurity concentration and dimensions of the punch-through suppression region portion are determined such that a voltage drop produced by the increased current between the first and second ohmic electrodes after the occurrence of punch-through in the punch-through generation region portion has a value which turns on the second pn junction.

9. A surge protection device according to any of claims 1 to 3, wherein said at least one third region is formed relative to said punch-through generation region portion by a self-alignment technique.

10. A surge protection device capable of absorbing surges of either polarity comprising a first semiconductor region, a second semiconductor region forming a first pn junction with the first semiconductor region, at least one third semiconductor region facing the first semiconductor region across the second semiconductor region and forming a second pn junction with the second semiconductor region, a fourth semiconductor region forming a third pn junction with the first semiconductor region at a place apart from the second semiconductor region, at least one fifth semiconductor region facing the first semiconductor region across the fourth semiconductor region and forming a fourth pn junction with the fourth semiconductor region, the second semiconductor region being comprised of a punch-through generation region portion and a punch-through suppression region portion, the punch-through suppression region portion of the second semiconductor region being disposed to cover corners of the at least one third semiconductor region, the punch-through generation region portion of the second semiconductor region being disposed only between flat facing portions of the at least one third semiconductor region and first semiconductor region, the fourth semiconductor region being comprised of a punch-through generation region portion and a punch-through suppression region portion, the punch-through suppression region portion of the fourth semiconductor region being disposed to cover corners of the at least one fifth semiconductor region, the punch-through generation region portion of the fourth semiconductor region being disposed only between flat facing portions of the at least one fifth semiconductor region and the first semiconductor region, a first ohmic electrode disposed in common ohmic contact with surfaces of the second and at least one third semiconductor regions, and a second ohmic electrode disposed in ohmic contact with surfaces of the fourth and at least one fifth semiconductor regions, wherein application across the first ohmic electrode and the second ohmic electrode of a surge of a polarity causing the first pn junction to be reverse biased causes a depletion layer to grow in the punch-through generation region portion of the second semiconductor region and reach the at least one third semiconductor region to cause punch-through and initiate breakdown operation between the first and at least one third semiconductor regions, whereafter current flowing between the first and second ohmic electrodes increases to produce in the second semiconductor region a voltage drop which turns on the second pn junction and causes the surge protection device to exhibit a breakover characteristic, and wherein application of a surge of a polarity causing the third pn junction to be reverse biased causes a depletion layer to grow in the punch-through generation region portion of the fourth semiconductor region and reach the at least one fifth semiconductor region to cause punch-through and initiate breakdown operation between the first and at least one fifth semiconductor regions, whereafter current flowing between the first and second ohmic electrodes increases to produce in the fourth semiconductor region a voltage drop which turns on the fourth pn junction and causes the surge protection device to exhibit a breakover characteristic;

wherein the punch-through generation region portion and the punch-through suppression region portion constituting the second semiconductor region are of the same conductivity type but an impurity concentration of the punch-through generation region portion is lower than that of the punch-through suppression region portion, whereby the punch-through generation region portion permits punch-through to occur between the first and at least one third semiconductor regions and the punch-through suppression region portion suppresses the occurrence of punch-through between the first and at least one third semiconductor regions, and wherein the punch-through generation region portion and the punch-through suppression region portion constituting the fourth semiconductor region are of the same conductivity type but the impurity concentration of the punch-through generation region portion is lower than that of the punch-through suppression region portion, whereby the punch-through generation region portion permits punch-through to occur between the first and at least one fifth semiconductor regions and the punch-through suppression region portion suppresses the occurrence of punch-through between the first and at least one fifth semiconductor regions.

11. A surge protection device capable of absorbing surges of either polarity comprising a first semiconductor region, a second semiconductor region forming a first pn junction with the first semiconductor region, at least one third semiconductor region facing the first semiconductor region across the second semiconductor region and forming a second pn junction with the second semiconductor region, a fourth semiconductor region forming a third pn junction with the first semiconductor region at a place apart from the second semiconductor region, at least one fifth semiconductor region facing the first semiconductor region across the fourth semiconductor region and forming a fourth pn junction with the fourth semiconductor region, the second semiconductor region being comprised of a punch-through generation region portion and a punch-through suppression region portion, the punch-through suppression region portion of the second semiconductor region being disposed to cover corners of the at least one third semiconductor region, the punch-through generation region portion of the second semiconductor region being disposed only between flat facing portions of the at least one third semiconductor region and first semiconductor region, the fourth semiconductor region being comprised of a punch-through generation region portion and a punch-through suppression region portion, the punch-through suppression region portion of the fourth semiconductor region being disposed to cover corners of the at least one fifth semiconductor region, the punch-through generation region portion of the fourth semiconductor region being disposed only between flat facing portions of the at least one fifth semiconductor region and the first semiconductor region, a first ohmic electrode disposed in common ohmic contact with surfaces of the second and at least one third semiconductor regions, and a second ohmic electrode disposed in ohmic contact with surfaces of the fourth and at least one fifth semiconductor regions, wherein application across the first ohmic electrode and the second ohmic electrode of a surge of a polarity causing the first pn junction to be reverse biased causes a depletion layer to grow in the punch-through generation region portion of the second semiconductor region and reach the at least one third semiconductor region to cause punch-through and initiate breakdown operation between the first and at least one third semiconductor regions, whereafter current flowing between the first and second ohmic electrodes increases to produce in the second semiconductor region a voltage drop which turns on the second pn junction and causes the surge protection device to exhibit a breakover characteristic, and wherein application of a surge of a polarity causing the third pn junction to be reverse biased causes a depletion layer to grow in the punch-through generation region portion of the fourth semiconductor region and reach the at least one fifth semiconductor region to cause punch-through and initiate breakdown operation between the first and at least one fifth semiconductor regions, whereafter current flowing between the first and second ohmic electrodes increases to produce in the fourth semiconductor region a voltage drop which turns on the fourth pn junction and causes the surge protection device to exhibit a breakover characteristic;

wherein the punch-through generation region portion and the punch-through suppression region portion constituting the second semiconductor region are of the same conductivity type but a thickness of the punch-through generation region portion is smaller than that of the punch-through suppression region portion at the corners of the at least one third semiconductor region, whereby the punch-through generation region portion permits punch-through to occur between the first and the at least one third semiconductor regions and the punch-through suppression region portion suppresses the occurrence of punch-through between the first and the at least one third semiconductor regions, and wherein the punch-through generation region portion and the punch-through suppression region portion constituting the fourth semiconductor region are of the same conductivity type but the thickness of the punch-through generation region portion is smaller than that of the punch-through suppression region portion at the corners of the at least one fifth semiconductor region, whereby the punch-through generation region portion permits punch-through to occur between the first and at least one fifth semiconductor regions and the punch-through suppression region portion suppresses the occurrence of punch-through between the first and at least one fifth semiconductor regions.

12. A surge protection device capable of absorbing surges of either polarity comprising a first semiconductor region, a second semiconductor region forming a first pn junction with the first semiconductor region, at least one third semiconductor region facing the first semiconductor region across the second semiconductor region and forming a second pn junction with the second semiconductor region, a fourth semiconductor region forming a third pn junction with the first semiconductor region at a place apart from the second semiconductor region, at least one fifth semiconductor region facing the first semiconductor region across the fourth semiconductor region and forming a fourth pn junction with the fourth semiconductor region, the second semiconductor region being comprised of a punch-through generation region portion and a punch-through suppression region portion, the punch-through suppression region portion of the second semiconductor region being disposed to cover corners of the at least one third semiconductor region, the punch-through generation region portion of the second semiconductor region being disposed only between flat facing portions of the at least one third semiconductor region and first semiconductor region, the fourth semiconductor region being comprised of a punch-through generation region portion and a punch-through suppression region portion, the punch-through suppression region portion of the fourth semiconductor region being disposed to cover corners of the at least one fifth semiconductor region, the punch-through generation region portion of the fourth semiconductor region being disposed only between flat facing portions of the at least one fifth semiconductor region and the first semiconductor region, a first ohmic electrode disposed in common ohmic contact with surfaces of the second and at least one third semiconductor regions, and a second ohmic electrode disposed in ohmic contact with surfaces of the fourth and at least one fifth semiconductor regions, wherein application across the first ohmic electrode and the second ohmic electrode of a surge of a polarity causing the first pn junction to be reverse biased causes a depletion layer to grow in the punch-through generation region portion of the second semiconductor region and reach the at least one third semiconductor region to cause punch-through and initiate breakdown operation between the first and at least one third semiconductor regions, whereafter current flowing between the first and second ohmic electrodes increases to produce in the second semiconductor region a voltage drop which turns on the second pn junction and causes the surge protection device to exhibit a breakover characteristic, and wherein application of a surge of a polarity causing the third pn junction to be reverse biased causes a depletion layer to grow in the punch-through generation region portion of the fourth semiconductor region and reach the at least one fifth semiconductor region to cause punch-through and initiate breakdown operation between the first and least one fifth semiconductor regions, whereafter current flowing between the first and second ohmic electrodes increases to produce in the fourth semiconductor region a voltage drop which turns on the fourth pn junction and causes the surge protection device to exhibit a breakover characteristic;

wherein the punch-through generation region portion and the punch-through suppression region portion constituting the second semiconductor region are of the same conductivity type but an impurity concentration of the punch-through generation region portion is lower and a thickness thereof smaller than an impurity concentration and a thickness of the punch-through suppression region portion, whereby the punch-through generation region portion permits punch-through to occur between the first and the at least one third semiconductor regions and the punch-through suppression region portion suppresses the occurrence of punch-through between the first and at least one third semiconductor regions, and wherein the punch-through generation region portion and the punch-through suppression region portion constituting the fourth semiconductor region are of the same conductivity type but the impurity concentration of the punch-through generation region portion is lower and the thickness thereof smaller than the impurity concentration and the thickness of the punch-through suppression region portion, whereby the punch-through generation region portion permits punch-through to occur between the first and at least one fifth semiconductor regions and the punch-through suppression region portion suppresses the occurrence of punch-through between the first and at least one fifth semiconductor regions.

13. A surge protection device according to any of claims 10 to 12, wherein the third semiconductor region is constituted as a plurality of separate third semiconductor regions, the punch-through suppression region portion of the second semiconductor region is constituted as a plurality of punch-through suppression region portions for covering the corners of the plurality of third semiconductor regions, and the punch-through generation region portion of the second semiconductor region is constituted as plurality of punch-through generation region portions one of which is disposed between each third semiconductor region and the first semiconductor region at said flat facing portions thereof, and wherein the at least fifth semiconductor region is constituted as a plurality of separate fifth semiconductor regions, the punch-through suppression region portion of the fourth semiconductor region is constituted as a plurality of punch-through suppression region portions for covering the corners of the plurality of fifth semiconductor regions, and the punch-through generation region portion of the fourth semiconductor region is constituted as plurality of punch-through generation region portions one of which is disposed between each fifth semiconductor region and the first semiconductor region at said flat facing -portions thereof.

14. A surge protection device according to any of claims 10 to 12, wherein the at least one third semiconductor region is constituted a plurality of third semiconductor regions, the punch-through generation region portion of the second semiconductor region is constituted as at least one punch-through generation region portion disposed between at least one third semiconductor region and the first semiconductor region at said flat facing portions thereof, and the punch-through suppression region portion of the second semiconductor region is constituted as a plurality of punch-through suppression region portions for covering the corners of the plurality of third semiconductor regions and covering bottom surfaces of the third semiconductor regions not provided with the punch-through generation region portion, and wherein the at least one fifth semiconductor region is constituted as a plurality of fifth semiconductor regions, the punch-through generation region portion of the fourth semiconductor region is constituted as at least one punch-through generation region portion disposed between at least one fifth semiconductor region and the first semiconductor region at said flat facing portions thereof, the punch-through suppression region portion of the fourth semiconductor region is constituted as a plurality of punch-through suppression region portions for covering the corners of the plurality of fifth semiconductor regions and bottom surfaces of the fifth semiconductor regions not provided with the punch-through generation region portion.

15. A surge protection device according to any of claims 10 to 12, wherein impurity concentration and dimensions of the punch-through suppression region portion of the second region are determined such that a voltage drop produced by the increased current between the first and second ohmic electrodes after the occurrence of punch-through in the punch-through generation region portion has a value which turns on the second pn junction, and impurity concentration and dimensions of the punch-through suppression region portion of the fourth region are determined such that a voltage drop produced by the increased current between the first and second ohmic electrodes after the occurrence of punch-through in the punch-through generation region portion has a value which turns on the fourth pn junction.

16. A surge protection device according to claim 13, wherein impurity concentration and dimensions of the punch-through suppression region portion of the second region are determined such that a voltage drop produced by the increased current between the first and second ohmic electrodes after the occurrence of punch-through in the punch-through generation region portion has a value which turns on the second pn junction, and the impurity concentration and dimensions of the punch-through suppression region portion of the fourth region are determined such that a voltage drop produced by the increased current between the first and second ohmic electrodes after the occurrence of punch-through in the punch-through generation region portion has a value which turns on the fourth pn junction.

17. A surge protection device according to claim 14, wherein impurity concentration and dimensions of the punch-through suppression region portion of the second region are determined such that a voltage drop produced by the increased current between the first and second ohmic electrodes after the occurrence of punch-through in the punch-through generation region portion has a value which turns on the second pn junction, and impurity concentration and dimensions of the punch-through suppression region portion of the fourth region are determined such that a voltage drop produced by the increased current between the first and second ohmic electrodes after the occurrence of punch-through in the punch-through generation region portion has a value which turns on the fourth pn junction.

18. A surge protection device according to any of claims 10 to 12, wherein said at least one third region is formed relative to said punch-through generation region portion of said second semiconductor region by a self-alignment technique, and said at least one fifth region is formed relative to said punch-through generation region portion of said fourth semiconductor region by a self-alignment technique.

* * * * *

UNITED STATES PATENT AND TRADEMARK OFFICE
CERTIFICATE OF CORRECTION

PATENT NO. : 5,486,709
DATED : January 23, 1996
INVENTOR(S) : Yutaka HAYASHI et al.

It is certified that error appears in the above-indentified patent and that said Letters Patent is hereby corrected as shown below:

On the title page, Item [73], the Assignees are incorrectly written. They should read:

--Agency of Industrial Science & Technology, Ministry of International Trade & Industry; Sankosha Corporation, both of Tokyo; Optotechno Co., Ltd., Kanagawa, all of Japan--

Signed and Sealed this

Seventh Day of May, 1996

Attest:

BRUCE LEHMAN

Attesting Officer

Commissioner of Patents and Trademarks